United States Patent
Lee et al.

(10) Patent No.: US 12,012,686 B2
(45) Date of Patent: Jun. 18, 2024

(54) WASHING MACHINE AND CLOTHES CARE APPARATUS

(71) Applicant: SAMSUNG ELECTRONICS CO., LTD., Suwon-si (KR)

(72) Inventors: Changwoo Lee, Suwon-si (KR); Dongwon Kim, Suwon-si (KR); Jiwoong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/712,396

(22) Filed: Apr. 4, 2022

(65) Prior Publication Data
US 2022/0282418 A1 Sep. 8, 2022

Related U.S. Application Data

(63) Continuation of application No. PCT/KR2021/015835, filed on Nov. 4, 2021.

(30) Foreign Application Priority Data

Mar. 4, 2021 (KR) .......................... 10-2021-0028528
Aug. 4, 2021 (KR) .......................... 10-2021-0102478

(51) Int. Cl.
*D06F 34/34* (2020.01)
*D06F 29/00* (2006.01)

(52) U.S. Cl.
CPC ............ *D06F 34/34* (2020.02); *D06F 29/005* (2013.01)

(58) Field of Classification Search
CPC ....................................................... D06F 34/34
See application file for complete search history.

(56) References Cited

U.S. PATENT DOCUMENTS

| 3,756,115 A | 9/1973 | Schuplin |
| 9,080,272 B2 | 7/2015 | Kim et al. |
| 2006/0219697 A1 | 10/2006 | Geiger et al. |

(Continued)

FOREIGN PATENT DOCUMENTS

| EP | 2 837 726 B1 | 10/2016 |
| EP | 3 162 947 A1 | 5/2017 |

(Continued)

OTHER PUBLICATIONS

Machine translation of KR20080023410A, dated Mar. 2008. (Year: 2008).*

(Continued)

*Primary Examiner* — Joseph L. Perrin
*Assistant Examiner* — Kevin G Lee
(74) *Attorney, Agent, or Firm* — STAAS & HALSEY LLP

(57) ABSTRACT

A washing machine including a cabinet, a tub disposed in the cabinet, a drum rotatably disposed in the tub, and a control device detachably mounted on the cabinet. The control device includes a control frame detachably mounted on a front surface of the cabinet, a control panel detachably mounted on the control frame and a control module interposed between the control frame and the control panel. The control panel configured to be movable between a first position where the control panel is detachable from the control frame and a second position where a forward and backward movement with reference to the control frame is limited.

16 Claims, 22 Drawing Sheets

(56) References Cited

U.S. PATENT DOCUMENTS

| | | | |
|---|---|---|---|
| 2007/0180728 A1 | 8/2007 | Kim et al. | |
| 2007/0220926 A1 | 9/2007 | Yoon | |
| 2012/0169193 A1* | 7/2012 | Kim | ............... D06F 34/08 |
| | | | 312/228 |

FOREIGN PATENT DOCUMENTS

| | | |
|---|---|---|
| EP | 3 187 647 A1 | 7/2017 |
| JP | 2005-34414 | 2/2005 |
| JP | 3830327 | 10/2006 |
| JP | 6788785 | 11/2020 |
| KR | 10-2006-0032317 | 4/2006 |
| KR | 10-2006-0120935 | 11/2006 |
| KR | 10-2007-0081859 A | 8/2007 |
| KR | 10-0793763 | 1/2008 |
| KR | 10-2008-0023410 | 3/2008 |
| KR | 10-1144996 | 5/2012 |
| KR | 10-2012-0075794 A | 7/2012 |
| KR | 10-1306698 | 9/2013 |
| KR | 10-1381144 | 4/2014 |
| KR | 10-2014-0101071 A | 8/2014 |

OTHER PUBLICATIONS

International Search Report dated Mar. 2, 2022 from International Application No. PCT/KR2021/015835.
Extended European Search Report dated Feb. 9, 2024 for European Application No. 21929303.2.

* cited by examiner

WASHING MACHINE AND CLOTHES CARE APPARATUS

CROSS-REFERENCE TO RELATED APPLICATION

This application is a continuation application under 35 U.S.C. § 111(a) of PCT Application No. PCT/KR2021/015835 filed Nov. 4, 2021 which claim the benefit of Korean Patent Application No. 10-2021-0028528 filed on Mar. 4, 2021 and Korean Patent Application No. 10-2021-0102478 filed on Aug. 4, 2021. The contents of PCT Application No. PCT/KR2021/015835 filed Nov. 4, 2021 and Korean Patent Application No. 10-2021-0028528 and Korean Patent Application No. 10-2021-0102478 are incorporated by reference herein in their entirety.

The present disclosure relates to a washing machine and a clothes care apparatus, and more particularly, to a washing machine and a clothes care apparatus each including a control device on a front surface.

BACKGROUND ART

In general, a washing machine is an apparatus used to wash laundry by rotating a cylindrical drum, in which the laundry and wash water are retained, in a tub. Washing machines are classified into drum washing machines in which a drum is horizontally disposed and laundry is washed while being lifted and tumbled down along an inner circumferential wall of the drum during rotation of the drum about a horizontal axis in forward and reverse directions and pulsator washing machines in which a drum provided with a pulsator is vertically disposed and laundry is washed by using water streams generated by the pulsator while the drum rotates about a vertical axis in forward and reverse directions.

A washing machine includes a cabinet defining an external appearance of the washing machine and having an inlet through which laundry is introduced, a tub installed in the cabinet to retain wash water, a drum to rotate in the tub by a rotational force of a motor, a door provided to open and close the inlet, and a control device configured to provide information on washing and detect an input of a user.

SUMMARY

The present disclosure is directed to a washing machine and a clothes care apparatus which allows a user to easily replace a control device of the washing machine and the clothes care apparatus.

The present disclosure is directed to a washing machine and a clothes care apparatus which allows a user to easily maintain and repair a control device of the washing machine and the clothes care apparatus.

One aspect of the present disclosure provides a washing machine including: a cabinet including a top cover and a front surface; a drum rotatably disposed in the cabinet; and a control assembly configured to be mountable on the front surface of the cabinet and demountable from the front surface of the cabinet without removing the top cover of the cabinet, wherein the control assembly includes, a frame configured to be mountable on the front surface of the cabinet and demountable from the front surface of the cabinet; a control panel configured to be mountable on the frame and demountable from the frame and configured to be movable between a first position where the control panel is separable from the frame and a second position where the control panel is coupled to the frame; and a printed circuit board configured to control the washing machine, the printed circuit board interposed between the frame and the control panel.

The frame may include a frame coupling part, and the control panel may include a panel coupling part configured to be couplable to the frame coupling part.

The frame may include a panel guide, and the control panel may include a coupling guide configured to be insertable into the panel guide while coupled to the frame.

The panel guide may include an inclined portion formed to be inclined in a direction where the coupling guide is inserted into the panel guide.

The coupling guide may be formed to prevent separation from the panel guide while the control panel is located at the second position.

The control panel may include a fixing guide, and the frame may include a panel fixing part configured to guide movement of the fixing guide and coupled to the fixing guide by a panel fixing member while the control panel is located at the second position.

The panel fixing member may be screw-coupled to the fixing guide and the panel fixing part.

The panel fixing member may be formed to be wedge shaped and may include a first end and a second end, wherein the first end is adjacent to the second end while the panel fixing member is coupled to the fixing guide and the panel fixing part, and the first end and the second end are spaced apart to fix the fixing guide and the panel fixing part while the panel fixing member is coupled to the fixing guide and the panel fixing part The control panel may include a fixing guide, and the frame may include: a panel fixing part configured to guide movement of the fixing guide; and a panel support configured to be elastically deformed while the control panel is located at the first position, and restored while the control panel is at the second position to support the fixing guide.

The cabinet may include a cabinet fixing part formed at a front surface, and the frame may include a frame fixing part formed to be fixed to the cabinet fixing part by a frame fixing member.

The control assembly may be separable from the cabinet in the forward and backward direction.

The control panel may include a module fixing part configured to fix the printed circuit board.

The control device may include a rotatable controller on the control panel that is configured to be couplable to the printed circuit board.

The frame may include a detergent case mount on which a detergent case is mountable.

Another aspect of the present disclosure provides a clothes care apparatus including: a washing machine; and a clothing dryer configured to be mountable on the washing machine and demountable from the washing machine, wherein the washing machine includes: a cabinet having a top cover and a front surface; a drum rotatably disposed in the cabinet; and a control assembly mountable on a front surface of the cabinet and demountable from the front surface of the cabinet without removing the top cover while the clothing dryer is mounted on the washing machine, the control assembly including a frame configured to be mountable on the front surface of the cabinet and demountable from the front surface of the cabinet; a control panel configured to be mountable on the frame and demountable from the frame and configured to be movable between a first position where the control panel is separable from the frame and a second position where the control panel is coupled to the frame; and a printed circuit board configured to control the washing machine, the printed circuit board interposed between the control frame and the control panel.

Another aspect of the present disclosure provides a washing machine including a cabinet including a front frame defining the front surface and a top cover constituting the upper surface, a tub disposed in the cabinet, a drum rotatably disposed in the tub, and a control device mounted on the cabinet to be separated therefrom in the forward and backward direction when the top cover is located on the front frame, wherein the control device includes a control frame detachably mounted on a front surface of the cabinet, a control panel detachably mounted on the control frame and provided to be movable between a first position where the control panel is detachable from the control frame and a second position where a forward and backward movement with reference to the control frame is limited, and a control module interposed between the control frame and the control panel.

The control frame may include a frame coupling part, and the control panel may include a panel coupling part provided to be coupled to the frame coupling part.

The control frame may include a panel guide, and the control panel may include a coupling guide provided to be guided by the panel guide when coupled to the control frame.

The control panel may include a fixing guide, and the control frame may include a panel fixing part to guide movement of the fixing guide and coupled to the fixing guide by the panel fixing member when the control panel is located at the second position.

The front frame may include a cabinet fixing part formed on the front surface, and the control frame may include a frame fixing part formed to be fixed to the cabinet fixing part by the frame fixing member.

In the first position the control panel may be separated from the frame.

In the second position the control panel may be connected to the frame.

According to the present disclosure, because the control device is coupled to the front surface of the cabinet in the washing machine and the clothes care apparatus, the control device may be easily replaced.

According to the present disclosure, because the control device is easily replaced in the washing machine and the clothes care apparatus, maintenance and/or repair of the control device may be easily performed.

DETAILED DESCRIPTION

Figure 1:
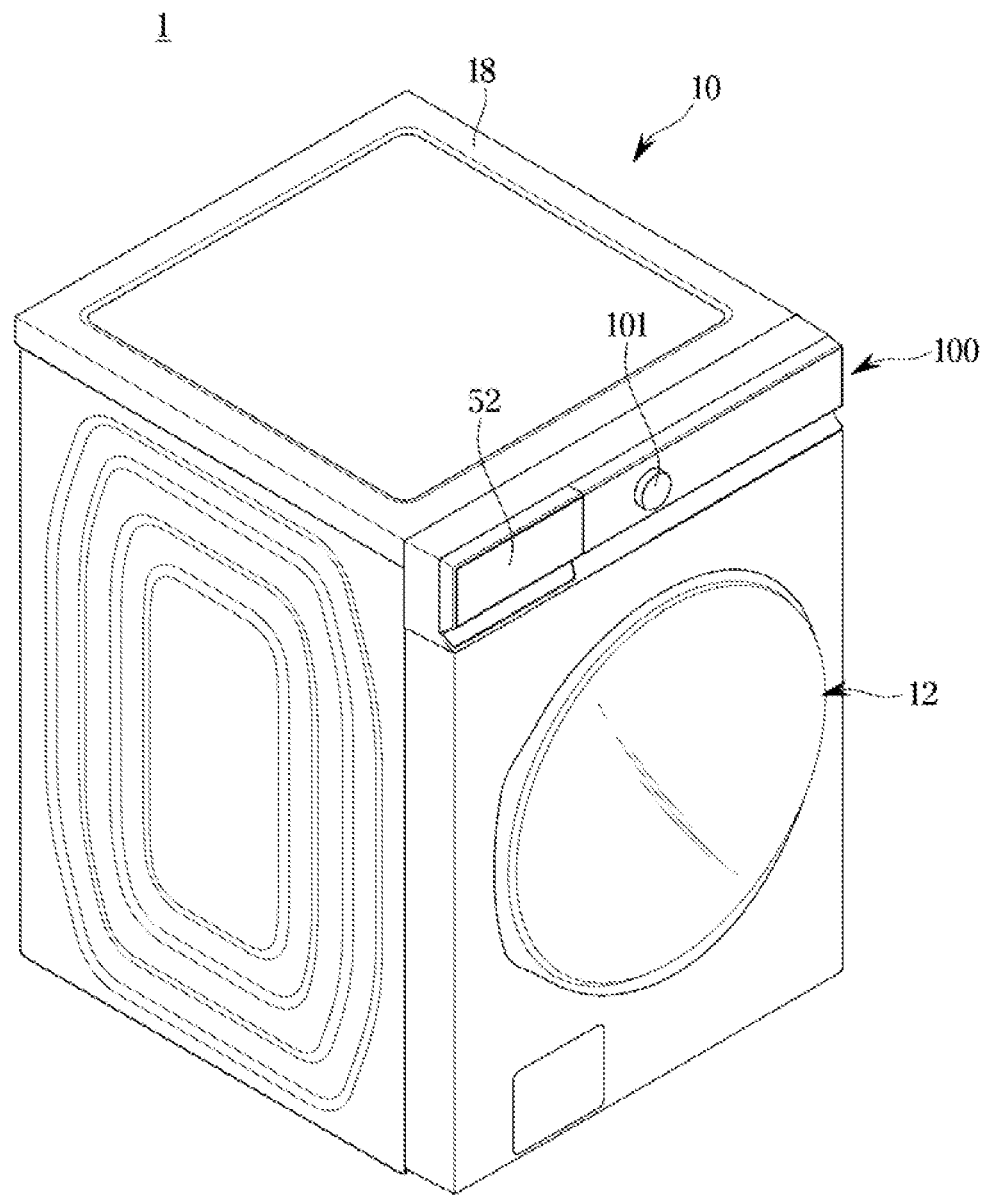
FIG. 1 is a view illustrating a washing machine according to an embodiment of the present disclosure.

Reference will now be made in detail to the embodiments of the present disclosure, examples of which are illustrated in the accompanying drawings. The embodiments described in the specification and shown in the drawings are only illustrative and are not intended to represent all aspects of the application, such that various modifications may be made without departing from the spirit of the application.

In the drawings, like reference numerals denote like elements or components having substantially same functions.

The terms used in the present specification are merely used to describe particular embodiments, and are not intended to limit the present disclosure. An expression used in the singular encompasses the expression of the plural unless it has a clearly different meaning in the context. In the present specification, it is to be understood that the terms such as "including" or "having," etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

It will be understood that, although the terms "first", "second", etc., may be used herein to describe various elements, these elements should not be limited by these terms. The above terms are used only to distinguish one component from another. For example, a first component discussed below could be termed a second component, and similarly, the second component may be termed the first component without departing from the teachings of this disclosure. As used herein, the term "and/or" includes any and all combinations of one or more of the associated listed items.

Hereinafter, embodiments of the present disclosure will be described in detail with reference to the accompanying drawings.

Figure 2:
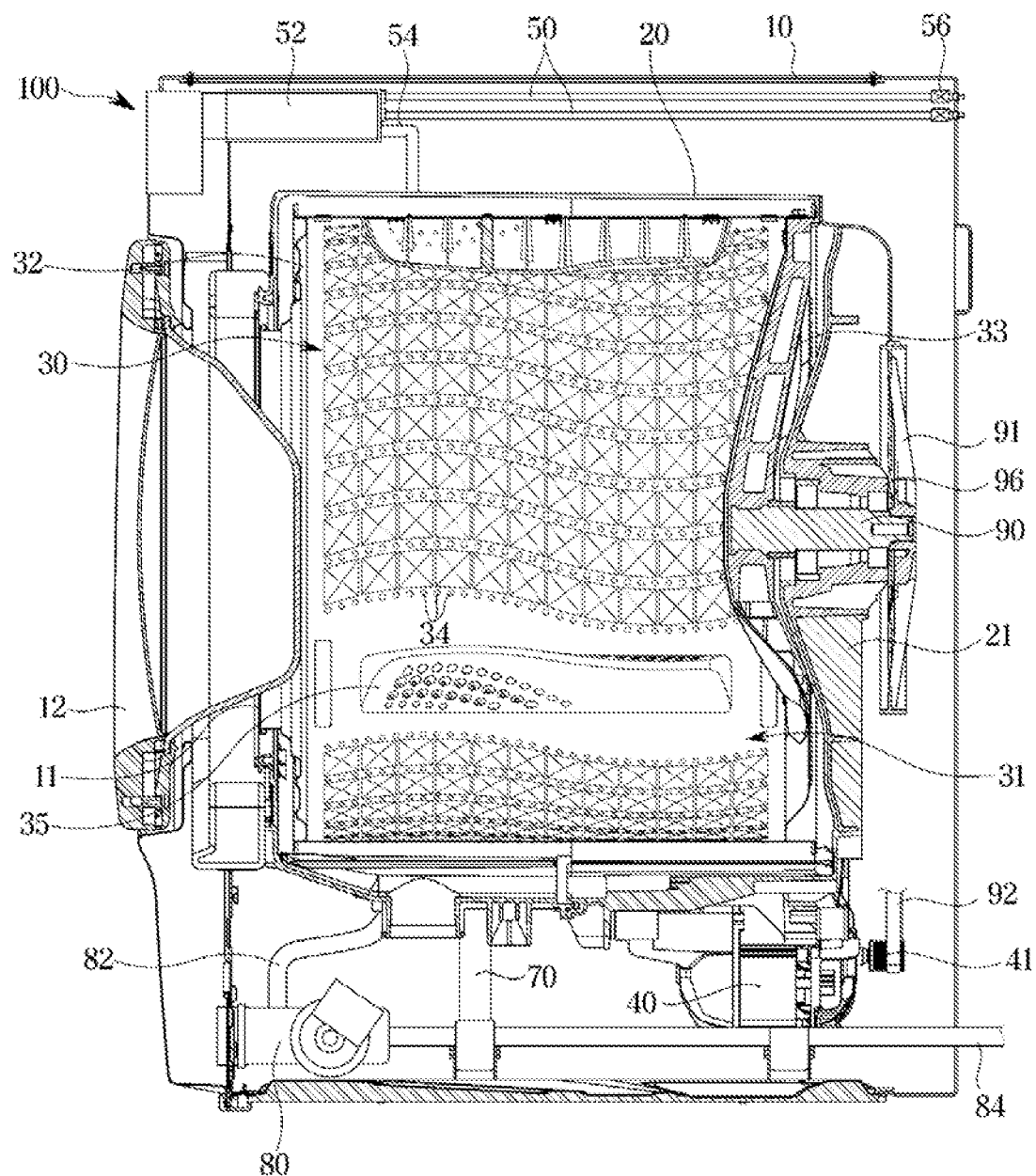
FIG. 2 is a side cross-sectional view of the washing machine of FIG. 1.

FIG. 1 is a view illustrating a washing machine according to an embodiment of the present disclosure. FIG. 2 is a side cross-sectional view of the washing machine of FIG. 1.

As shown in FIGS. 1 and 2, a washing machine 1 includes a cabinet 10 defining an external appearance, a tub 20 disposed in the cabinet 10, a drum 30 rotatably disposed in the tub 20, and a drive motor 40 configured to drive the drum 30.

The cabinet 10 may include a front frame 13 constituting a front surface. An inlet 11 is formed in the front frame 13 of the cabinet 10 such that laundry is introduced into the drum 30. The inlet 11 is open and closed by a door 12 installed at a front surface of the cabinet 10.

A water supply pipe 50 to supply wash water into the tub 20 is installed at an upper portion of the tub 20. One end of the water supply pipe 50 is connected to a water supply valve 56, and the other end of the water supply pipe 50 is connected to a detergent case 52.

The detergent case 52 is connected to the tub 20 via a connection pipe 54. Water supplied through the water supply pipe 50 is supplied into the tub 20 together with a detergent after passing through the detergent case 52.

The tub 20 is supported by a damper 70. The damper 70 connects the internal bottom surface of the cabinet 10 with the external surface of the tub 20.

The drum 30 includes a cylinder part 31, a front plate 32 disposed at the front of the cylinder part 31, and a rear plate 33 disposed at the rear of the cylinder part 31. An opening, through which laundry is introduced and removed, is formed at the front plate 32, and a shaft 90 to transmit a power from the drive motor 40 is connected to the rear plate 33.

A plurality of through holes 34, through which wash water flows, are formed at the circumference of the drum 30, and a plurality of lifters 35, by which laundry is lifted and tumbled while the drum 30 is rotated, are installed at the inner circumference of the drum 30.

The drum 30 is connected to the drive motor 40 via the shaft 90, and washing machines are classified, according to connection type between the shaft 90 and the drive motor 40, into a direct driving type in which the shaft 90 is directly connected to the drive motor 40 to rotate the drum 30, and an indirect driving type in which the shaft 90 is connected to the drive motor via a pulley 91 to drive the drum 30.

The washing machine 1 according to an embodiment of the present disclosure may be provided as the indirect type, but the embodiment is not limited thereto, and technical features of the present disclosure may also be applied to the direct driving type.

One end of the shaft 90 is connected to the rear plate 33 of the drum 30, and the other end of the shaft 90 extends to the outside of a rear portion 21 of the tub 20. The other end of the shaft 90 may be provided to be inserted into the pulley 91 to receive the drive power from the drive motor 40. Also, a motor pulley 41 is formed at a rotation shaft of the drive motor 40. A drive belt 92 is provided between the motor pulley 41 and the pulley 91 and the shaft 90 may be driven by the drive belt 92.

The drive motor 40 may be disposed at a portion below the tub 20 and drive the shaft 90 while the drive belt 92 rotates in a clockwise or counterclockwise direction in the upward and downward direction of the tub 20.

A bearing housing 96 is installed at the rear portion 21 of the tub 20 to rotatable support the shaft 90. The bearing housing 96 may be formed of an aluminum alloy and may be inserted into the rear portion 21 of the tub 20 when the tub 20 is injection molded.

Under the tub 20, a drain pump 80 to drain water contained in the tub 20 out of the cabinet 10, a connection hose 82 to connect the tub 20 with the drain pump 82 to allow water contained in the tub 20 to flow into the drain pump 80, and a drain hose 84 to guide water pumped by the drain pump 80 out of the cabinet 10.

Meanwhile, a control device 100 may be disposed on the front frame 13 of the cabinet 10 to display a state of the washing machine 1 to a user or to receive an input to operate the washing machine 1 from the user. The control device 100 may also be referred to as control assembly 100.

Figure 3:
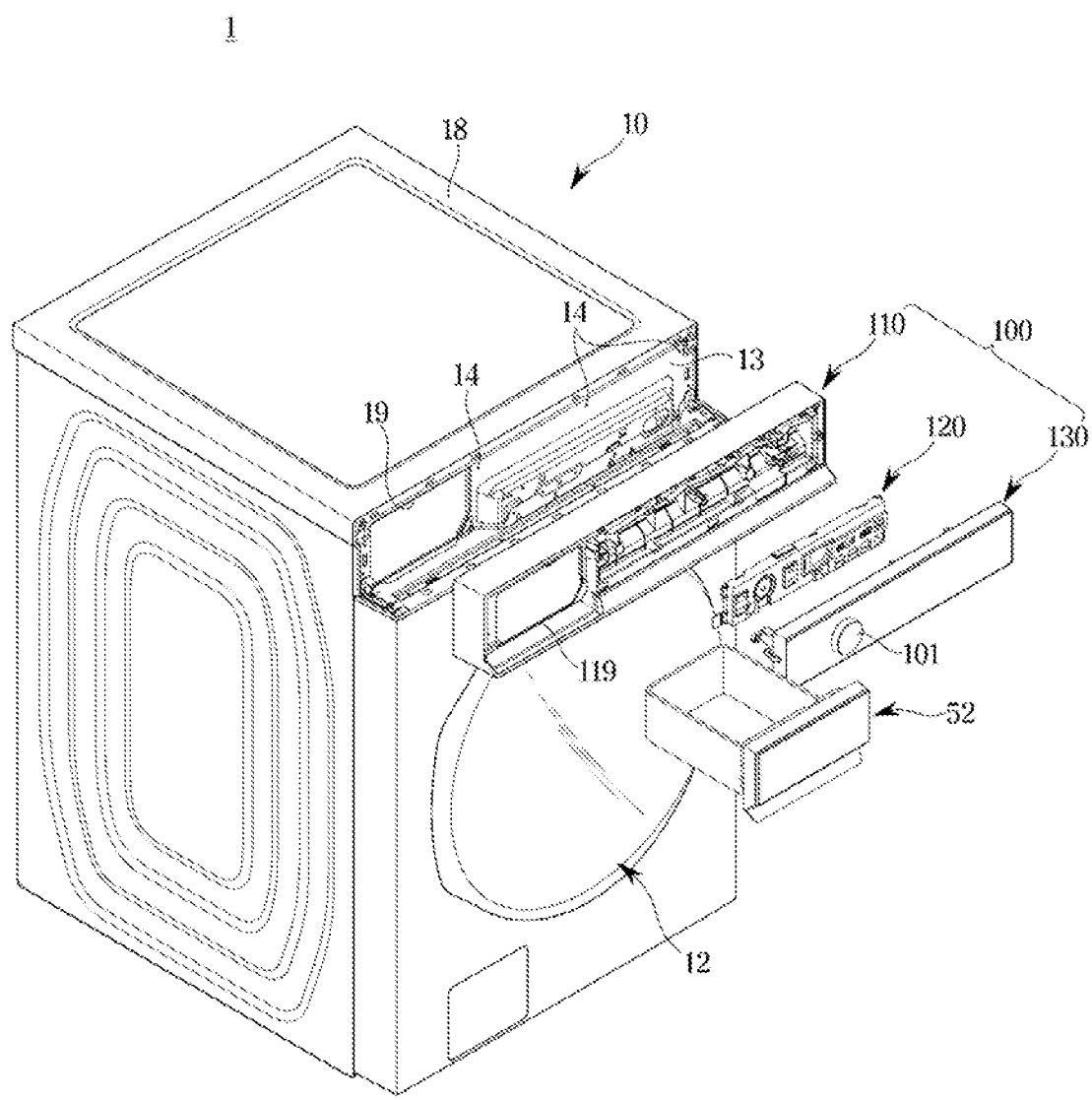
FIG. 3 is an exploded view of a control device of the washing machine illustrated in FIG. 1.

FIG. 3 is an exploded view of the control device of the washing machine illustrated in FIG. 1.

Referring to FIG. 3, the control device 100 may be provided to be mountable to and demountable from the front frame 13 of the washing machine 1. The control device 100 may include a control frame 110 (also referred to as frame 110) mountable to and demountable from the front frame 13, a control panel 130 mountable to and demountable from the control frame 110, and a control module 120 interposed between the control frame 110 and the control panel 130.

The front frame 13 may include a detergent case passage 19 through which the detergent case 52 passes. The control frame 110 may include a detergent case mount 119 on which the detergent case 52 is mounted. The detergent case mount 119 may be provided to correspond to the detergent case passage 19.

Figure 4:
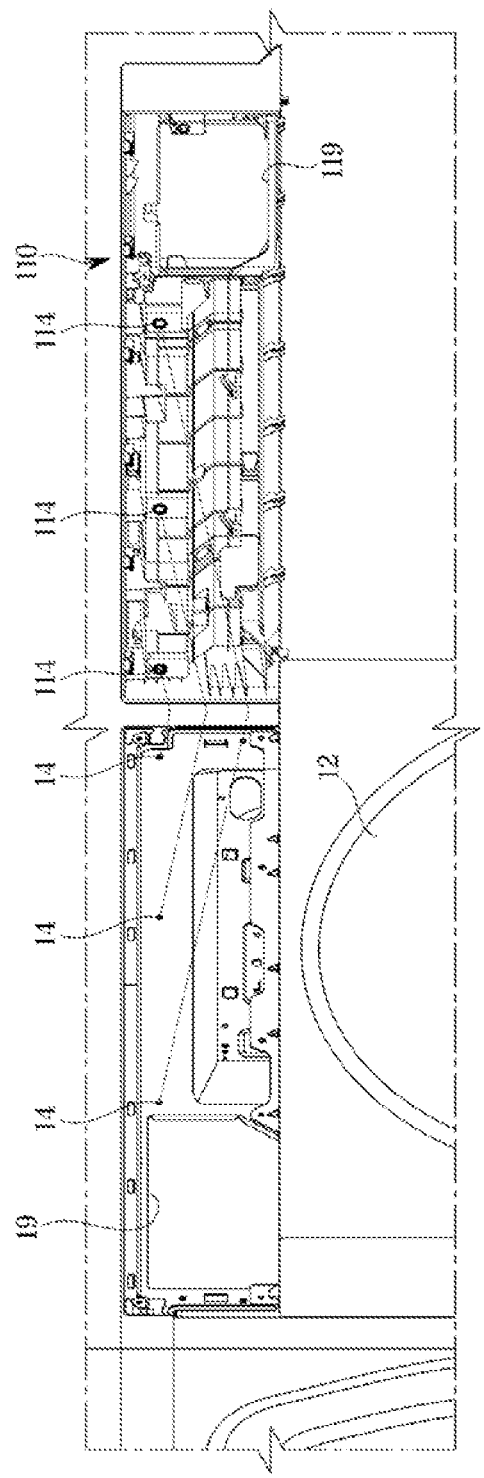
FIG. 4 illustrates that a control frame is coupled to a front frame of the washing machine shown in FIG. 3.
Figure 5:
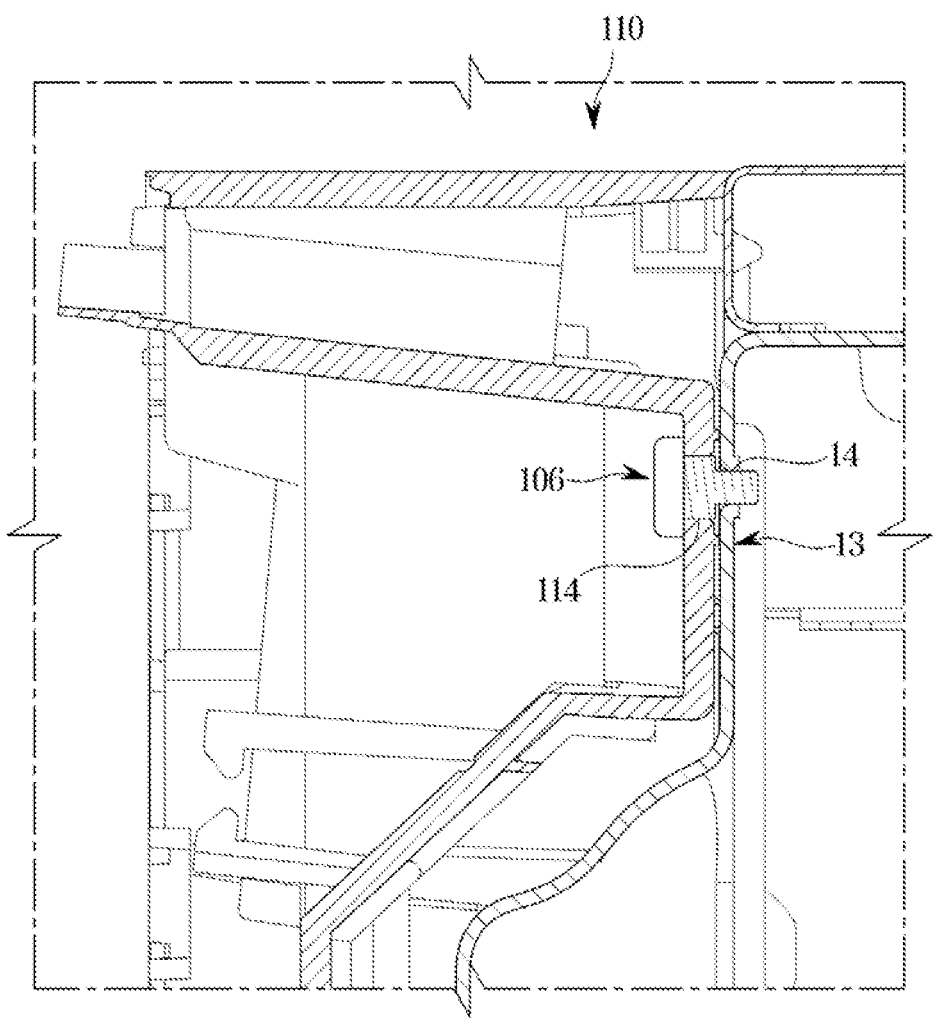
FIG. 5 is a cross-sectional view illustrating that the control frame is mounted on the front frame of the washing machine illustrated in FIG. 4 and fixed thereto by a frame fixing member.

FIG. 4 illustrates that the control frame is coupled to the front frame of the washing machine shown in FIG. 3. FIG. 5 is a cross-sectional view illustrating that the control frame is mounted on the front frame of the washing machine illustrated in FIG. 4 and fixed thereto by a frame fixing member.

Referring to FIG. 4, the control frame 110 may be coupled to the front frame 13 in the forward and backward direction. The front frame 13 may include a cabinet fixing part 14. The control frame 110 may include a frame fixing part 114 provided to correspond to the cabinet fixing part 14.

Referring to FIG. 5, the control frame 110 may be fixed to the front frame 13 as a frame fixing member 106 passes through the frame fixing part 114 and the cabinet fixing part 14 in a state where the frame fixing part 114 is located on the front frame 13 to be aligned with the cabinet fixing part 14.

The control frame 110 is fixed to the cabinet 10 by being coupled thereto in the forward and backward direction. The control frame 110 is not coupled to a top cover 18 of the cabinet 10 in the upward and downward direction. The control frame 110 is not coupled to the front frame 13 of the cabinet 10 in the upward and downward direction. Therefore, the control device 100 may be separated from the cabinet 10 without separating the top cover 18 from the cabinet 10.

Figure 6:
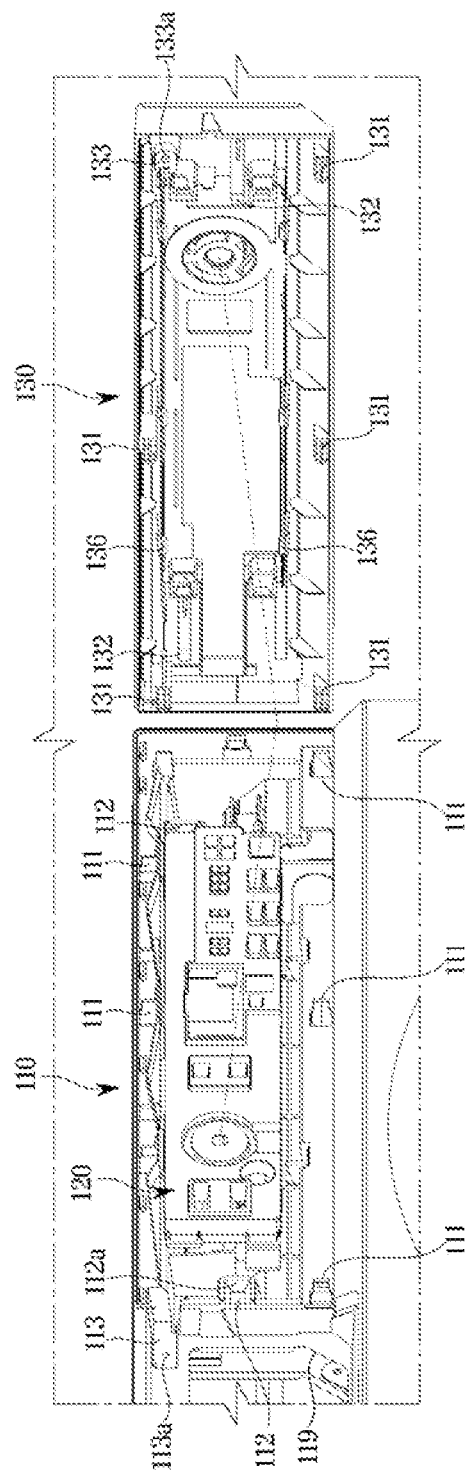
FIG. 6 shows that a control module is mounted on the control frame, which is mounted on the front frame of the washing machine illustrated in FIG. 5, and a control panel is mounted thereon.
Figure 7:
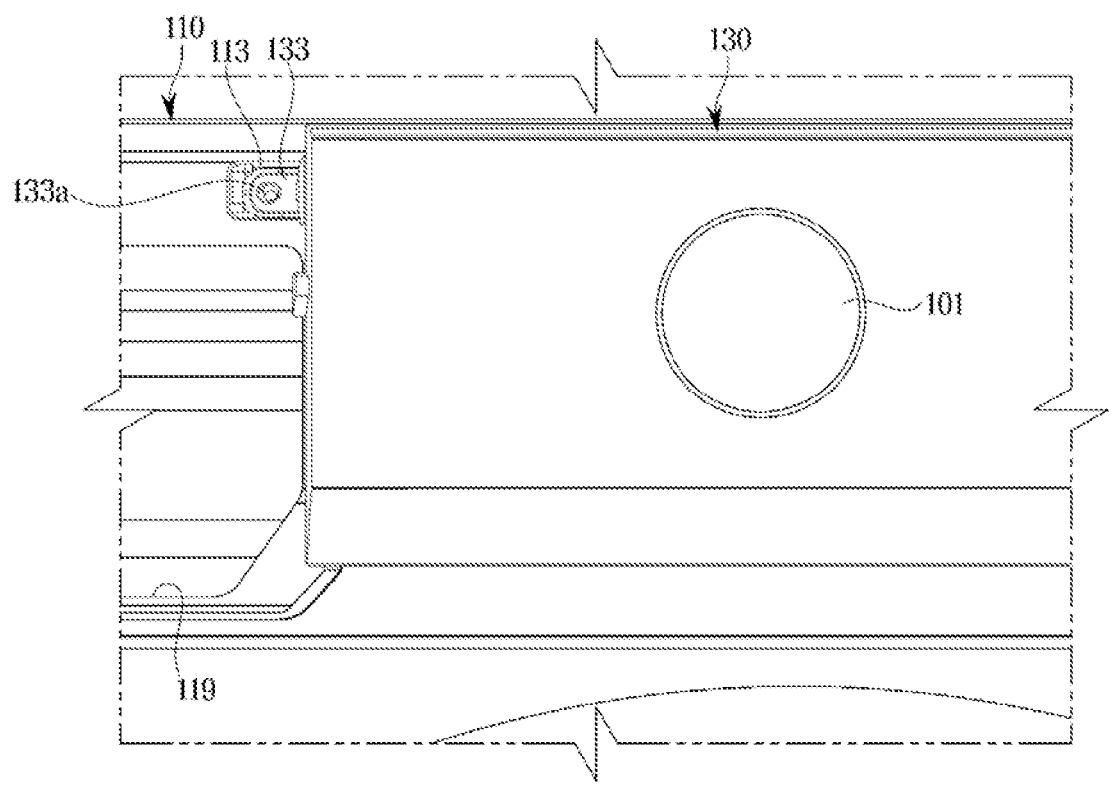
FIG. 7 illustrates a portion of a front surface of the control panel illustrated in FIG. 6 when the control panel is coupled to the control frame at a first position.
Figure 8:
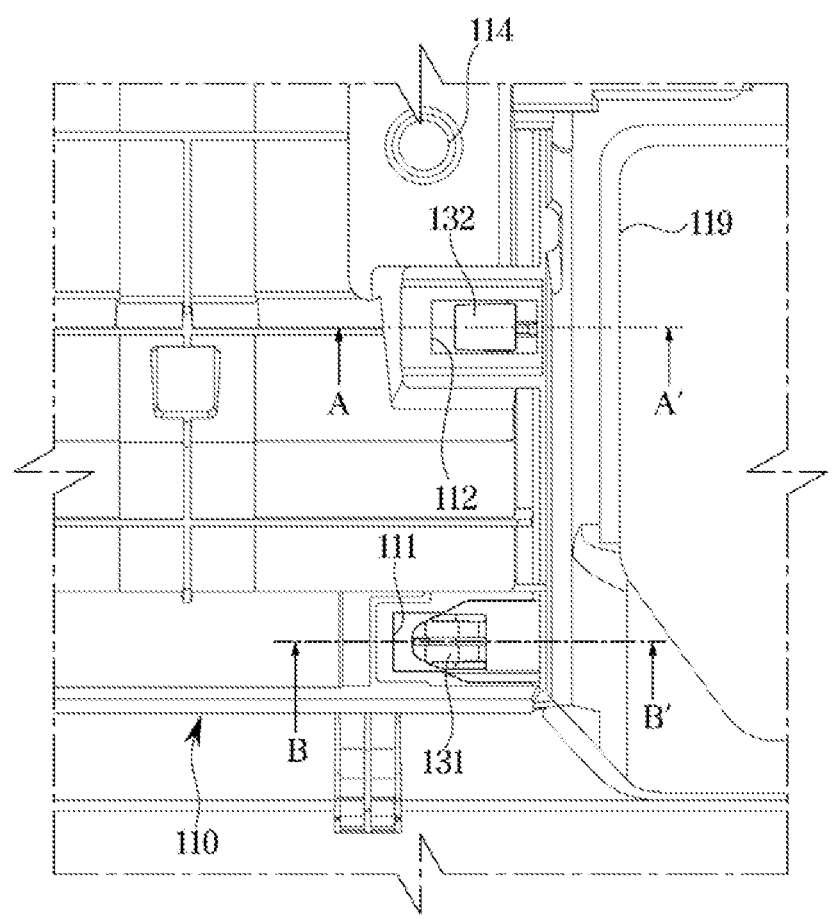
FIG. 8 illustrates portions of rear surfaces of the control panel and the control frame illustrated in FIG. 7.
Figure 9:
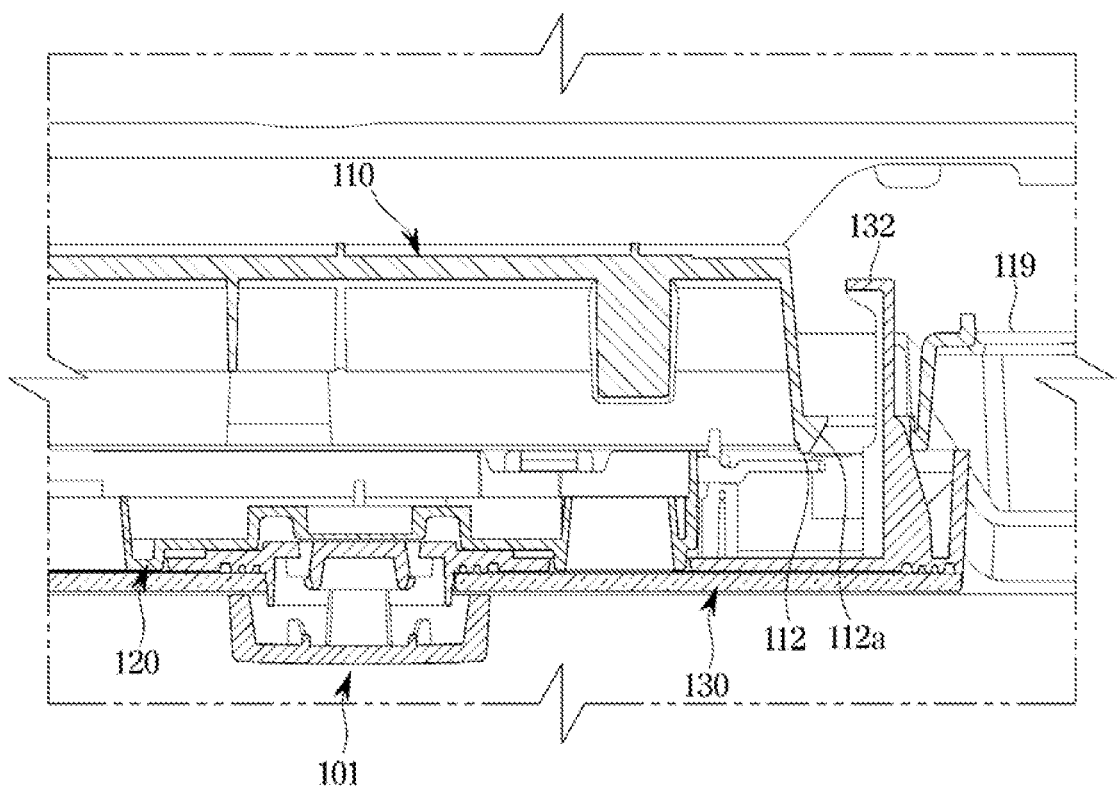
FIG. 9 is a cross-sectional view taken along line A-A' of FIG. 8.
Figure 10:
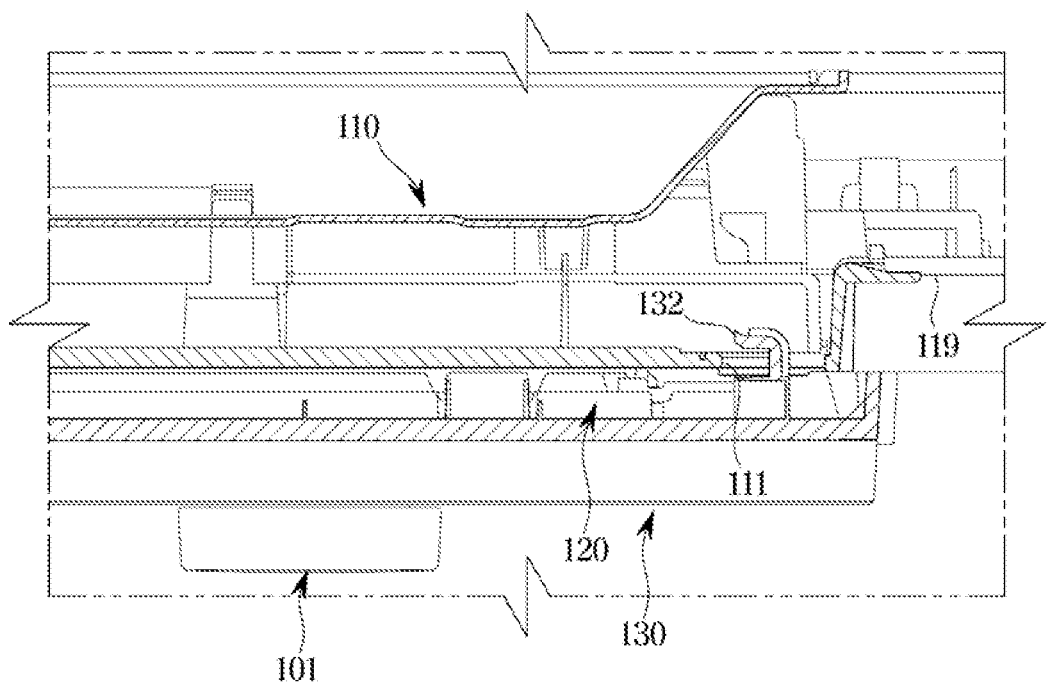
FIG. 10 is a cross-sectional view taken along line B-B' of FIG. 8.
Figure 11:
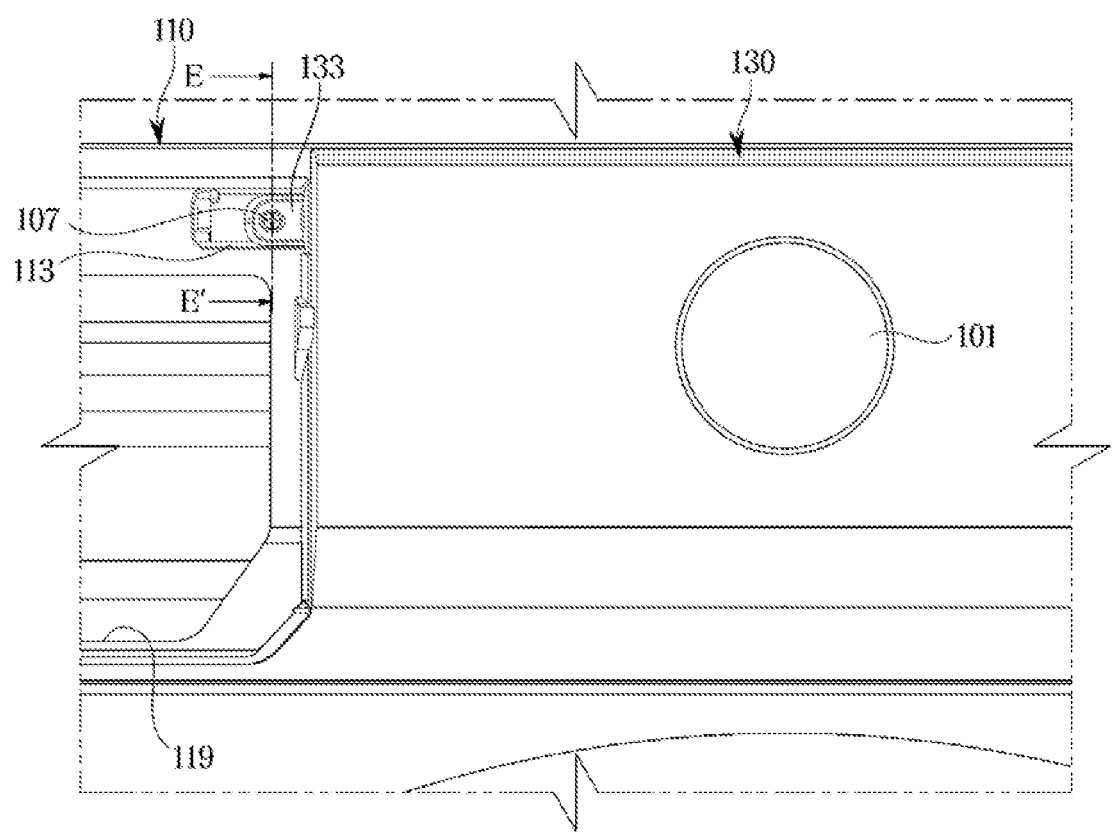
FIG. 11 illustrates a portion of the front surface of the control panel illustrated in FIG. 7 when the control panel slides to a second position with reference to the control frame.
Figure 12:
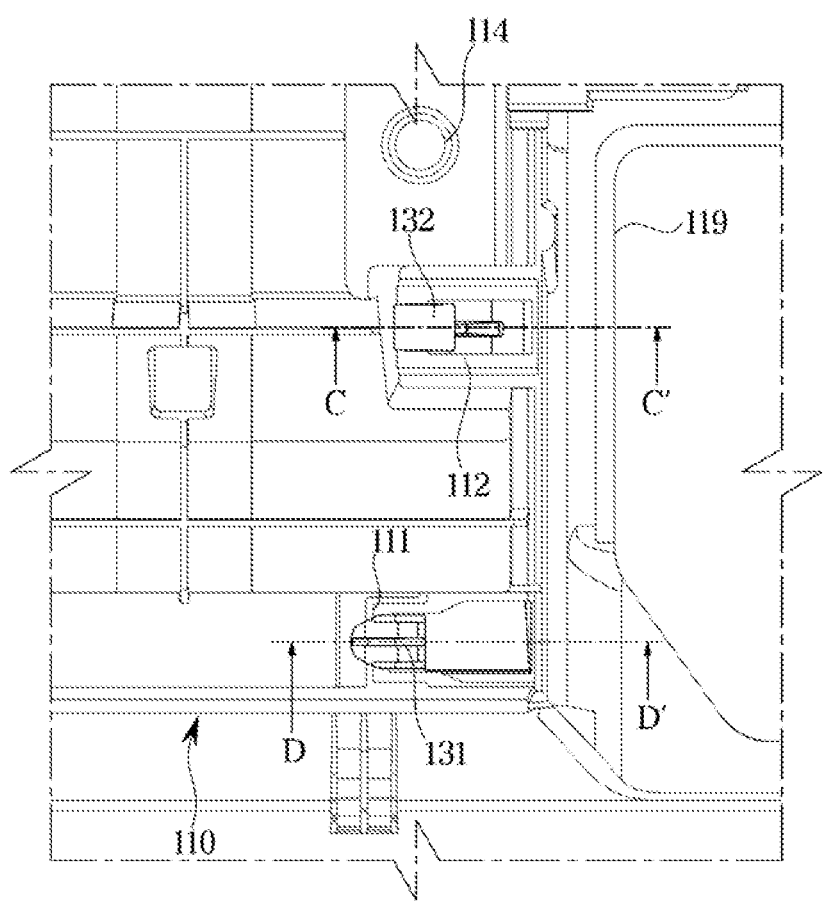
FIG. 12 illustrates portions of the rear surfaces of the control panel and the control frame illustrated in FIG. 11.
Figure 13:
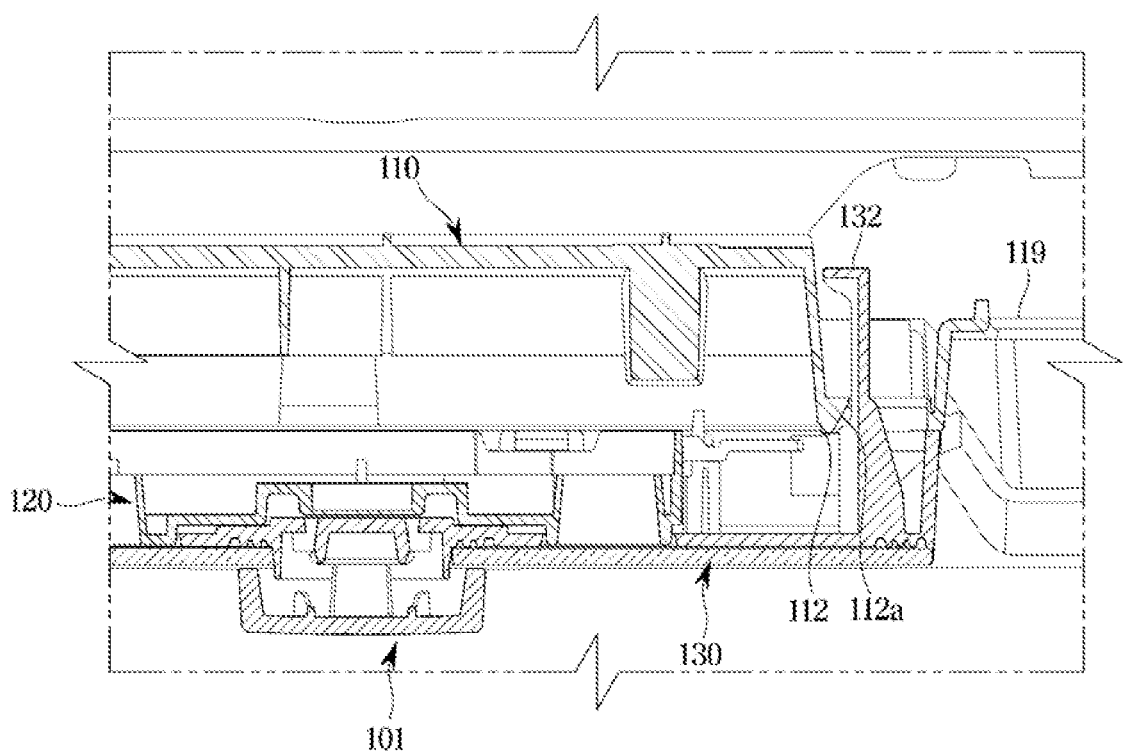
FIG. 13 is a cross-sectional view taken along line C-C' of FIG. 12.
Figure 14:
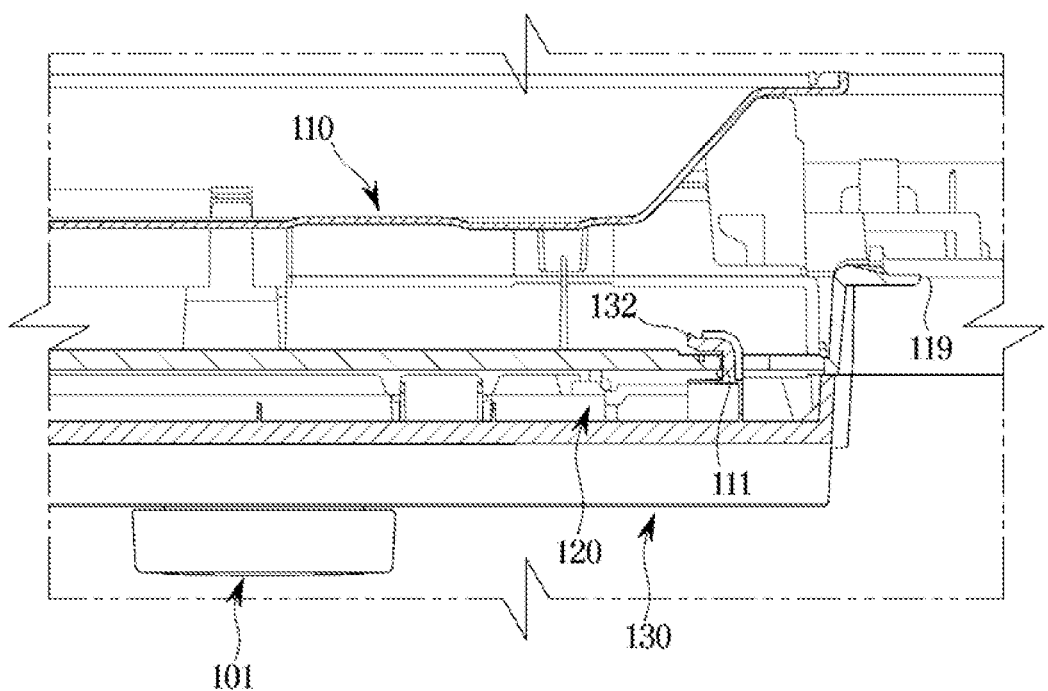
FIG. 14 is a cross-sectional view taken along line D-D' of FIG. 12.
Figure 15:
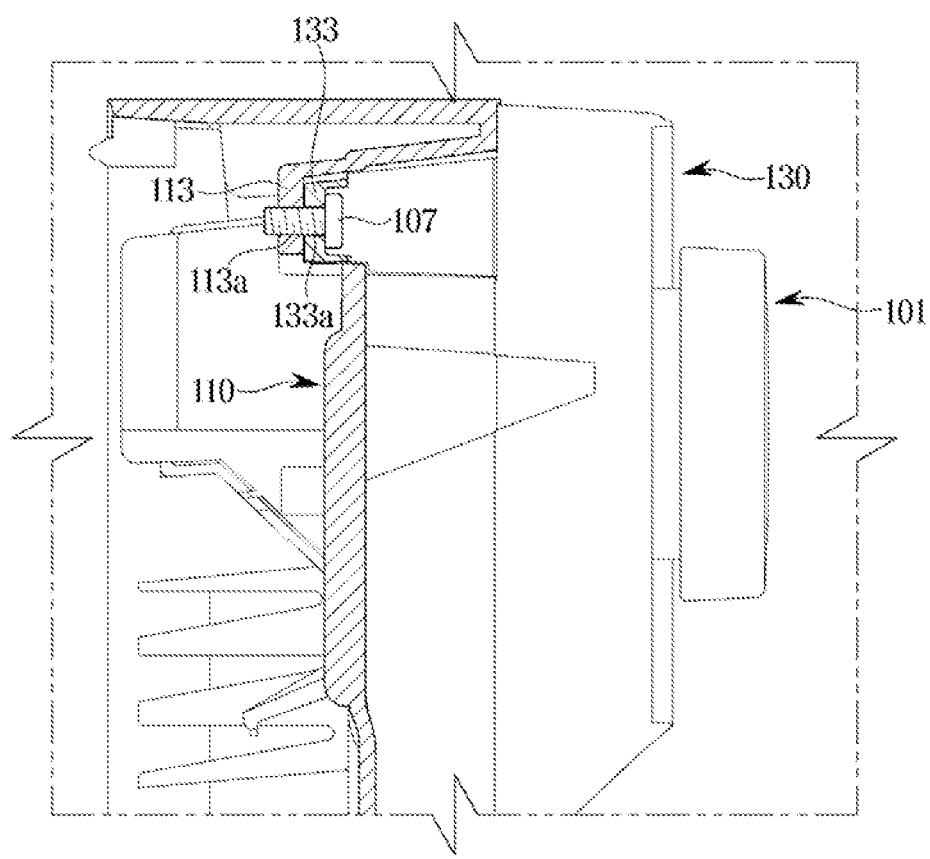
FIG. 15 is a cross-sectional view taken along line E-E' of FIG. 11.

FIG. 6 shows that the control module is mounted on the control frame, which is mounted on the front frame of the washing machine illustrated in FIG. 5, and the control panel is mounted thereon. FIG. 7 illustrates a portion of a front surface in which the control panel illustrated in FIG. 6 is coupled to the control frame at a first position. FIG. 8 illustrates portions of rear surfaces of the control panel and the control frame illustrated in FIG. 7. FIG. 9 is a cross-sectional view taken along line A-A' of FIG. 8. FIG. 10 is a cross-sectional view taken along line B-B' of FIG. 8. FIG. 11 illustrates a portion of the front surface in which the control panel illustrated in FIG. 7 slides to a second position with reference to the control frame. FIG. 12 illustrates portions of the rear surfaces of the control panel and the control frame illustrated in FIG. 11. FIG. 13 is a cross-sectional view taken along line C-C' of FIG. 12. FIG. 14 is a cross-sectional view taken along line D-D' of FIG. 12. FIG. 15 is a cross-sectional view taken along line E-E' of FIG. 11.

Referring to FIG. 6, the control module 120 may be accommodated between the control frame 110 mounted on the front frame 13 and the control panel 130. The control module 120 may be fixed to the control panel 130. The control panel 130 may include a module fixing part 136 formed on the rear surface to fix the control module 120. The module fixing part 136 may be hooked to an edge of the control module 120. Alternatively, the control module 120 may be fixed to the control frame 110. The control module 120 may be coupled to the control frame 110 and/or the control panel 130 in the forward and backward direction.

The control module 120 may include a printed circuit board (PCB). The control module 120 may be provided to control the washing machine 1.

The control panel 130 may be coupled to the control frame 110 in the forward and backward direction. The control frame 110 may include a frame coupling part 111 to mount the control panel 130, a panel guide 112, and a panel fixing part 113. The control panel 130 may include a panel coupling part 131, a coupling guide 132, and a fixing guide 133. The front surface of the control panel 130 may be configured to include glass.

The control device 100 may include a controller 101 provided to be operatable by the user. The controller 101 may be provided as a knob. The controller 101 may penetrate the control panel 130. The controller 101 may be provided to be rotatable about the control panel 130. The controller 101 may be coupled to the control module 120.

The panel coupling part 131 may be provided to correspond to the frame coupling part 111. The frame coupling part 111 may be formed as an opening. The panel coupling part 131 may be provided to be inserted into the frame coupling part 111. The frame coupling part 111 may support the panel coupling part 131 to prevent the panel coupling part 131 from being separated therefrom after the panel coupling part 131 is inserted thereinto and moves by a predetermined distance. A plurality of frame coupling parts 111 may be provided. A plurality of panel coupling parts 131 may be provided to correspond to the frame coupling parts 111.

The coupling guide 132 may be provided to correspond to the panel guide 112. The panel guide 112 may be formed as an opening. The coupling guide 132 may be provided to be inserted into the panel guide 112. The panel guide 112 may support the coupling guide 132 to prevent the coupling guide 132 from being separated therefrom after the coupling guide 132 is inserted thereinto and moves by a predetermined distance. A plurality of panel guides 112 may be provided. A plurality of coupling guides 132 may be provided to correspond to the panel guides 112.

The panel guide 112 may include an inclined portion 112a formed to guide the coupling guide 132 in an insertion direction. The inclined portion 112a may be formed to be inclined in a direction toward the center of the panel guide 112 in the insertion direction of the coupling guide 132 into the panel guide 112. By the inclined portion 112a, the control panel 130 may be coupled to the control frame 110 at the first position shown in FIG. 7.

The panel fixing part 113 may be provided to correspond to the fixing guide 133. The panel fixing part 113 may have a groove shape. The fixing guide 133 may be provided to slide in a state being securely mounted on the panel fixing part 113. The panel fixing part 113 may guide the fixing guide 133 such that the control panel 130 moves between the first position and the second position with reference to the control frame 110.

Referring to FIGS. 7 to 12, a process of mounting the control panel 130 on the control frame 110 will be described. The control panel 130 may be fixed to the control frame 110 after being coupled to the control frame 110 at the first position as shown in FIG. 7 and then sliding into the second position as shown in FIG. 8.

Specifically, referring to FIG. 7, the control panel 130 may be coupled to the control frame 110 by aligning the fixing guide 133 to be securely mounted on the panel fixing part 113.

Referring to FIGS. 8 and 9, the control panel 130 may be coupled to the control frame 110 by aligning the coupling guide 132 to be inserted into the panel guide 112. In this regard, the coupling guide 132 may guide the control panel 130 to be located at the first position with reference to the control frame 110 by the inclined portion 112a of the panel guide 112.

Referring to FIGS. 8 and 10, the control panel 130 may be coupled to the control frame 110 by aligning the panel coupling part 131 to be inserted into the frame coupling part 111.

Referring to FIG. 11, the control panel 130 may slide to the second position with reference to the control frame 110. Accordingly, a guide hole 133a of the fixing guide 133 may be aligned with a panel fixing hole 113a of the panel fixing part 113. Referring to FIG. 15, the control panel 130 may be fixed to the control frame 110 as a panel fixing member 107 is coupled to the guide hole 133a and the panel fixing hole 113a in a state where the guide hole 133a of the fixing guide 133 is aligned with the panel fixing hole 113a of the panel fixing part 113. The panel fixing member 107 may be screw-coupled to the panel fixing hole 113a and the guide hole 133a.

Referring to FIGS. 12 and 13, as the control panel 130 slides into the second position with reference to the control frame 110, the coupling guide 132 moves to a position where separation thereof from the panel guide 112 is prevented. That is, in the case where a force is applied to the control panel 130 in a direction to separate the control panel 130 from the control frame 110 in a state where the control panel 130 is located at the second position with reference to the control frame 110, the coupling guide 132 is interrupted by the panel guide 112 so that separation from the panel guide 112 may be prevented.

Referring to FIGS. 12 and 14, as the control panel 130 slides into the second position with reference to the control frame 110, the panel coupling part 131 may be hooked by the frame coupling part 111. That is, the panel coupling part 131 moves in a position where separation from the frame coupling part 111 is prevented. In the case where a force is applied to the control panel 130 in a direction to separate the control panel 130 from the control frame 110 in a state where the control panel 130 is at the second position with reference to the control frame 110, the panel coupling part 131 is interrupted by the frame coupling part 111 so that separation from the frame coupling part 111 may be prevented.

According to this configuration, the control device 100 may be separated from the cabinet 10 without separating the top cover 18 in the washing machine 1 according to an embodiment of the present disclosure, and thus the control device 100 may be easily replaced thereby facilitating maintenance and/or repair of the control device 100.

In addition, because the control panel 130 is easily separated from the control frame 110 in the washing machine 1 according to an embodiment of the present disclosure, the control module 120 may be easily replaced.

Figure 16:
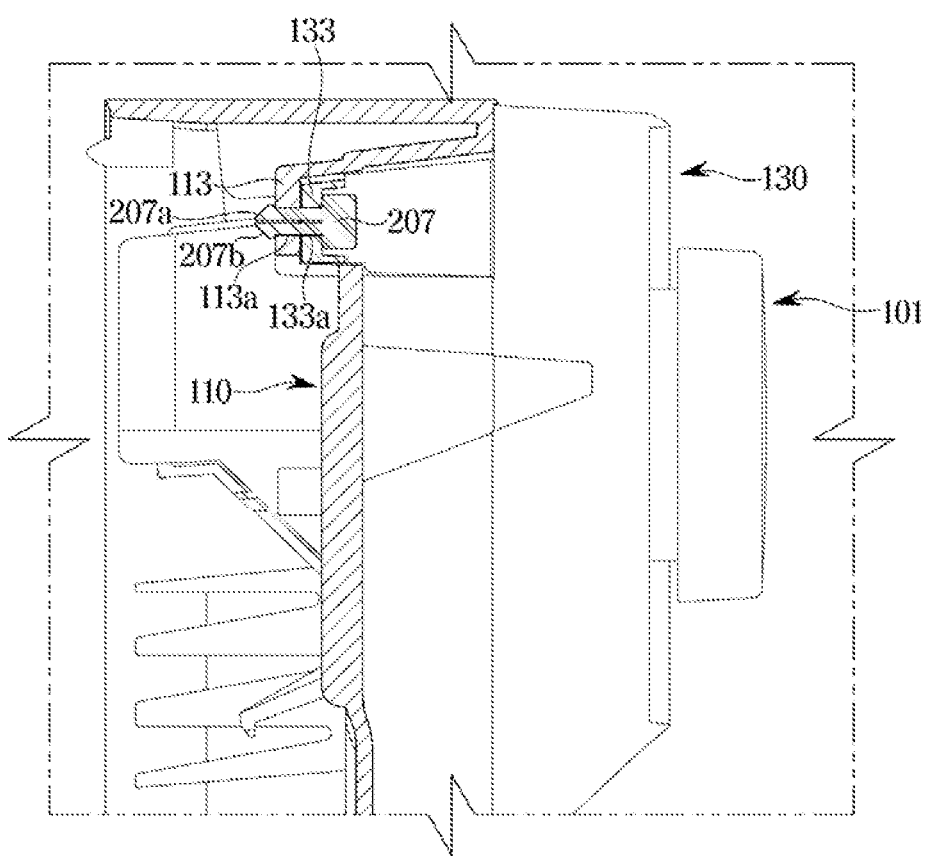
FIG. 16 illustrates another example of the panel fixing member illustrated in FIG. 15.

FIG. 16 illustrates another example of the panel fixing member illustrated in FIG. 15.

Referring to FIG. 16, a panel fixing member 207 for fixing the control panel 130 to the control frame 110 according to another embodiment will be described. However, the same reference numerals are assigned to the same components as those illustrated in FIG. 15 and detailed descriptions thereof may be omitted.

Referring to FIG. 16, the control panel 130 may be fixed to the control frame 110 by coupling the panel fixing member 207 to the guide hole 133a and the panel fixing hole 113a in a state where the guide hole 133a of the fixing guide 133 is aligned with the panel fixing hole 113a of the panel fixing part 113. The panel fixing member 207 may have a wedge shape. The panel fixing member 207 may be provided such that a first end 207a and a second end 207b become closer to each other in an insertion direction into the guide hole 133a and the panel fixing hole 113a. Thus, while the panel fixing member 207 passes through the guide hole 133a and the panel fixing hole 113a, the first end 207a and the second end 207b of the panel fixing member 207 may become closer to each other. When the panel fixing member 207 is coupled thereto after passing through the guide hole 133a and the panel fixing hole 113a, the first end 207a and the second end 207b of the panel fixing member 207 become farther from each other to prevent the panel fixing member 207 from being separated from the guide hole 133a and the panel fixing hole 113a. The panel fixing member 207 may be formed of a material with a predetermined elasticity.

Figure 17:
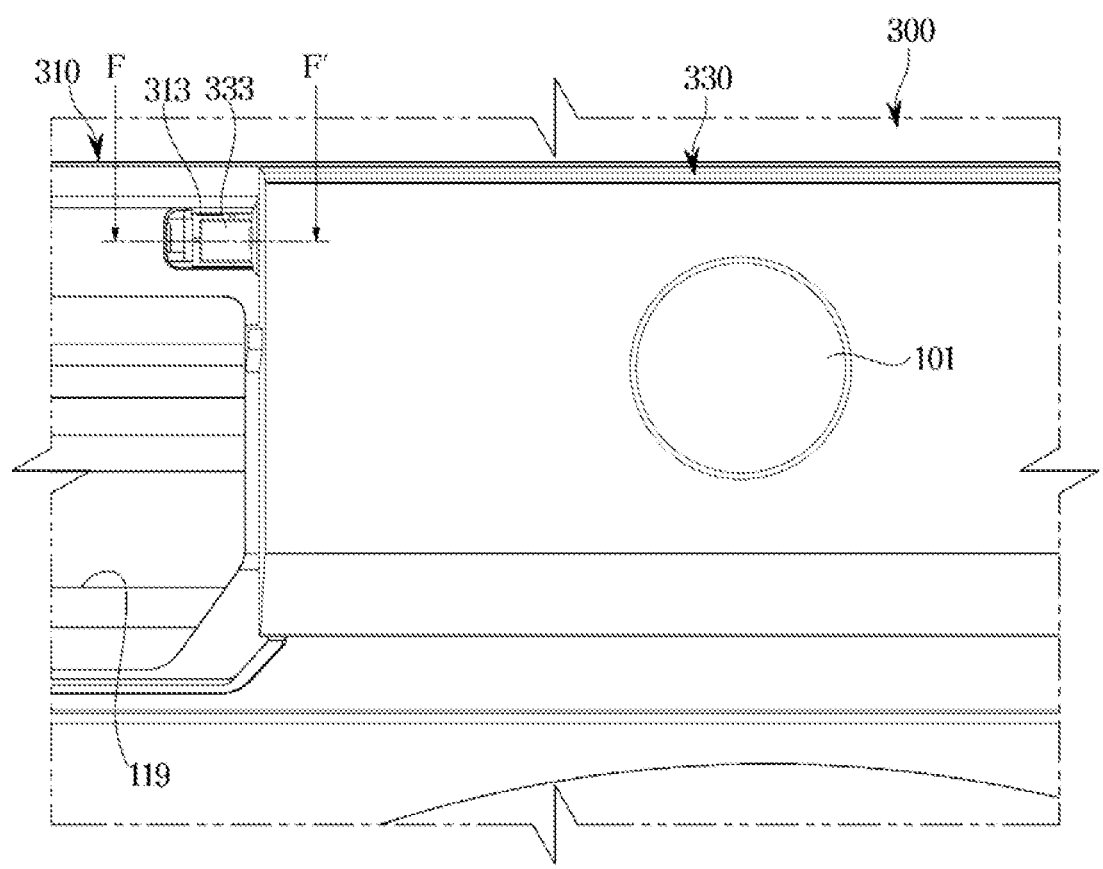
FIG. 17 illustrates a control device is coupled to a control frame according to another embodiment of the present disclosure.
Figure 18:
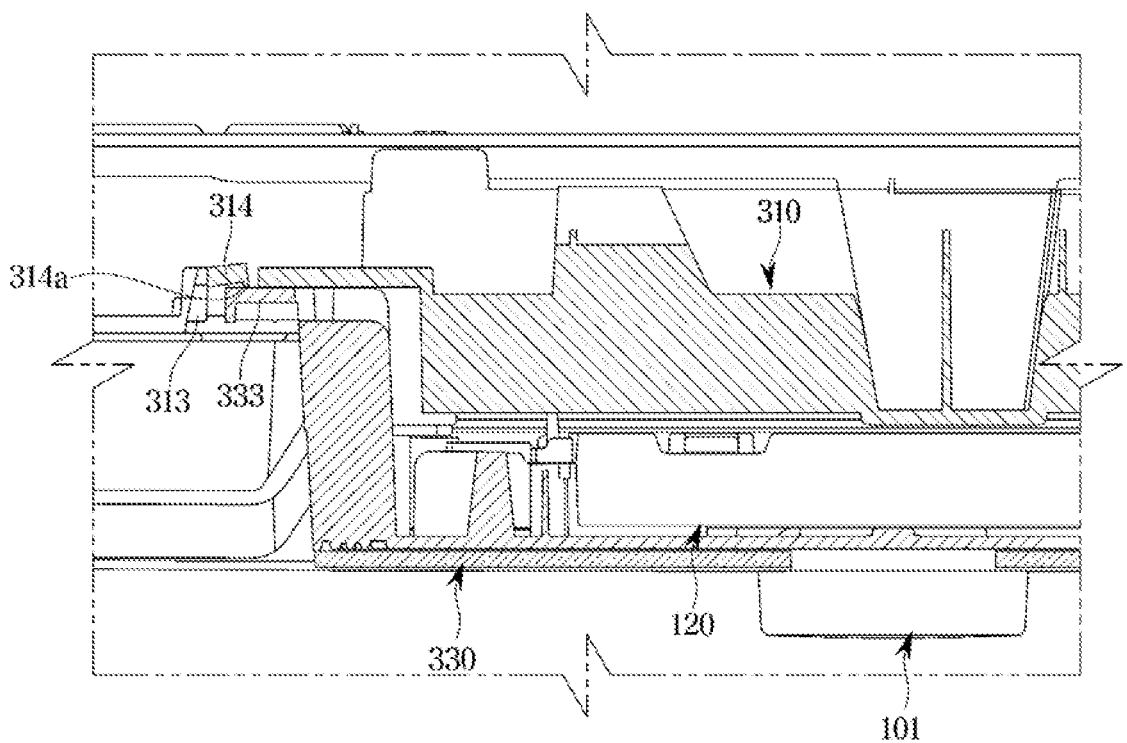
FIG. 18 is a cross-sectional view taken along line F-F' of FIG. 17.
Figure 19:
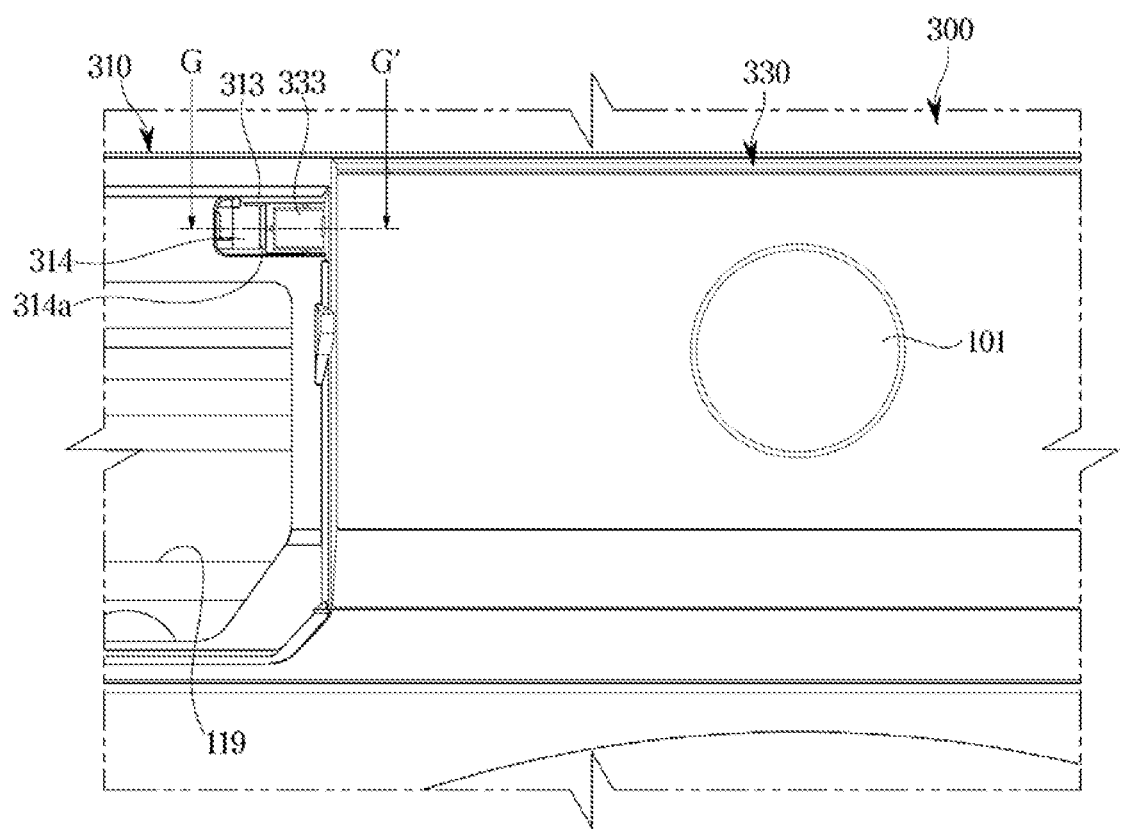
FIG. 19 illustrates that the control panel illustrated in FIG. 17 is fixed to the control frame.
Figure 20:
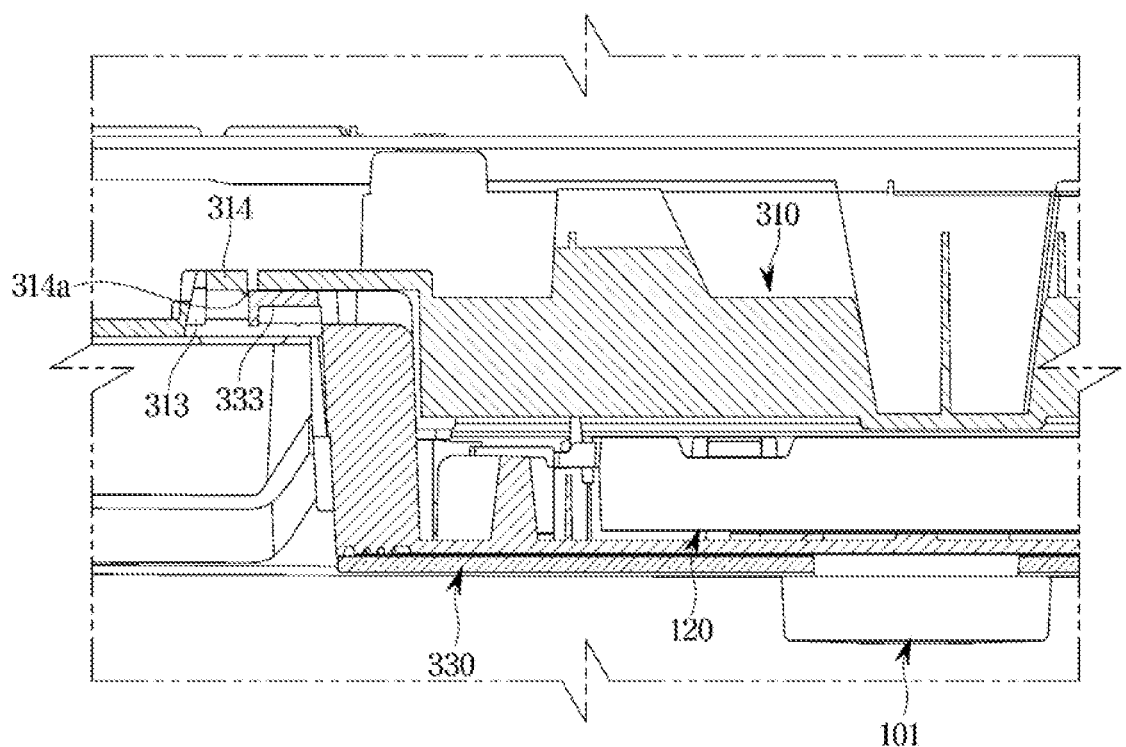
FIG. 20 is a cross-sectional view taken along line G-G' of FIG. 19.

FIG. 17 illustrates a control pane of a control device is coupled to a control frame according to another embodiment of the present disclosure. FIG. 18 is a cross-sectional view taken along line F-F' of FIG. 17. FIG. 19 illustrates that the control panel illustrated in FIG. 17 is fixed to the control frame. FIG. 20 is a cross-sectional view taken along line G-G' of FIG. 19.

Referring to FIGS. 17 to 20, a control device 300 according to another embodiment of the present disclosure will be described. However, the same reference numerals are assigned to the same components as those of the control device 100 illustrated in FIGS. 1 to 15 and detailed descriptions thereof may be omitted.

Referring to FIGS. 17 and 18, a method of fixing a control panel 330 to a control frame 310 of the control device 300 is different from that of the control device 100 illustrated in FIGS. 1 to 15.

Specifically, a panel fixing part 313 of the control device 300 may include a panel support 314. The panel fixing part 313 may have a groove shape. A fixing guide 333 of the control panel 330 may be slidably mounted on the panel fixing part 313.

The panel support 314 may be formed of a material with a predetermined elasticity. Referring to FIG. 18, when the control panel 330 is located at the first position with reference to the control frame 310, the panel support 314 may be pressed by the fixing guide 333 and deformed. Specifically, a supporting end 314a of the panel support 314 may be pressed by the fixing guide 333. The supporting end 314a may protrude from one surface of the panel support 314.

Referring to FIGS. 19 and 20, when the control panel 330 moves to the second position with reference to the control frame 310, the fixing guide 333 moves to a position not to press the panel support 314, and the panel support 314 returns to the previous position before the panel support 314 is pressed by a restoring force. Accordingly, the supporting end 314a of the panel support 314 supports the fixing guide 333 to prevent the fixing guide 333 from moving from the second position to the first position.

According to this configuration, the control panel 330 may be detachably fixed to the control frame 310 using a simple manner in the control device 300 according to another embodiment of the present disclosure.

Figure 21:
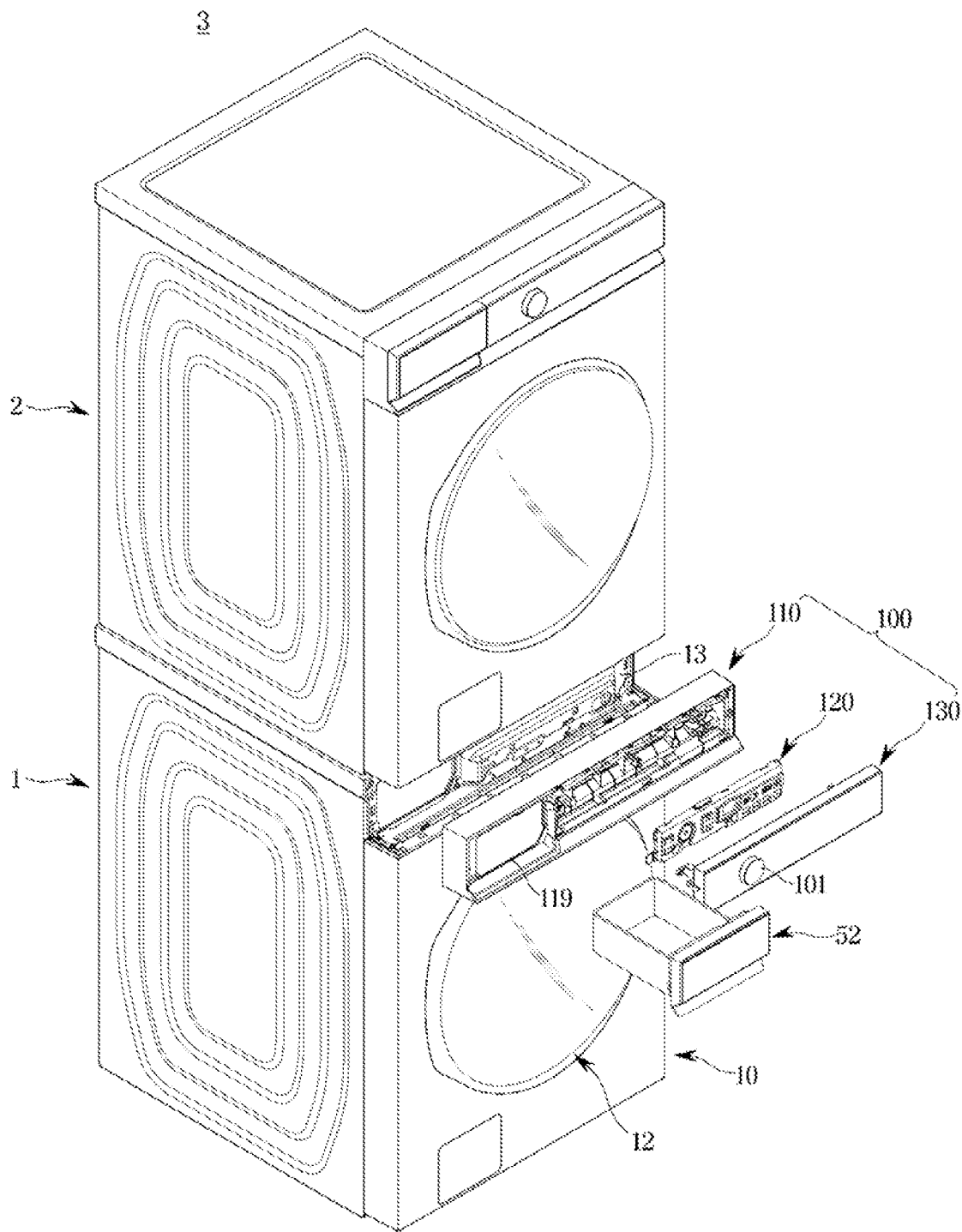
FIG. 21 shows a clothes care apparatus including the washing machine illustrated in FIG. 1.

FIG. 21 shows a clothes care apparatus including the washing machine illustrated in FIG. 1.

Referring to FIG. 21, a clothes care apparatus 3 in which a clothing dryer 2 is disposed on the washing machine 1 illustrated in FIG. 1 will be described.

When the washing machine 1 according to an embodiment of the present disclosure is used in a clothes care apparatus 3 together with the clothing dryer 2, the control device 100 may be easily separated from the cabinet 10 without separating the clothing dryer 2 from the washing machine 1. That is, because the control device 100 of the washing machine 1 according to an embodiment of the present disclosure is provided to be separated from the front frame 13 of the cabinet 10 in the forward and backward direction, the control device 100 may be easily separated from the washing machine 1 without separating the clothing dryer 2 disposed thereon from the washing machine 1.

The clothing dryer 2 disposed on the washing machine 1 is an example of a clothes care device, and the clothes care device disposed on the washing machine 1 may be a washing machine.

Figure 22:
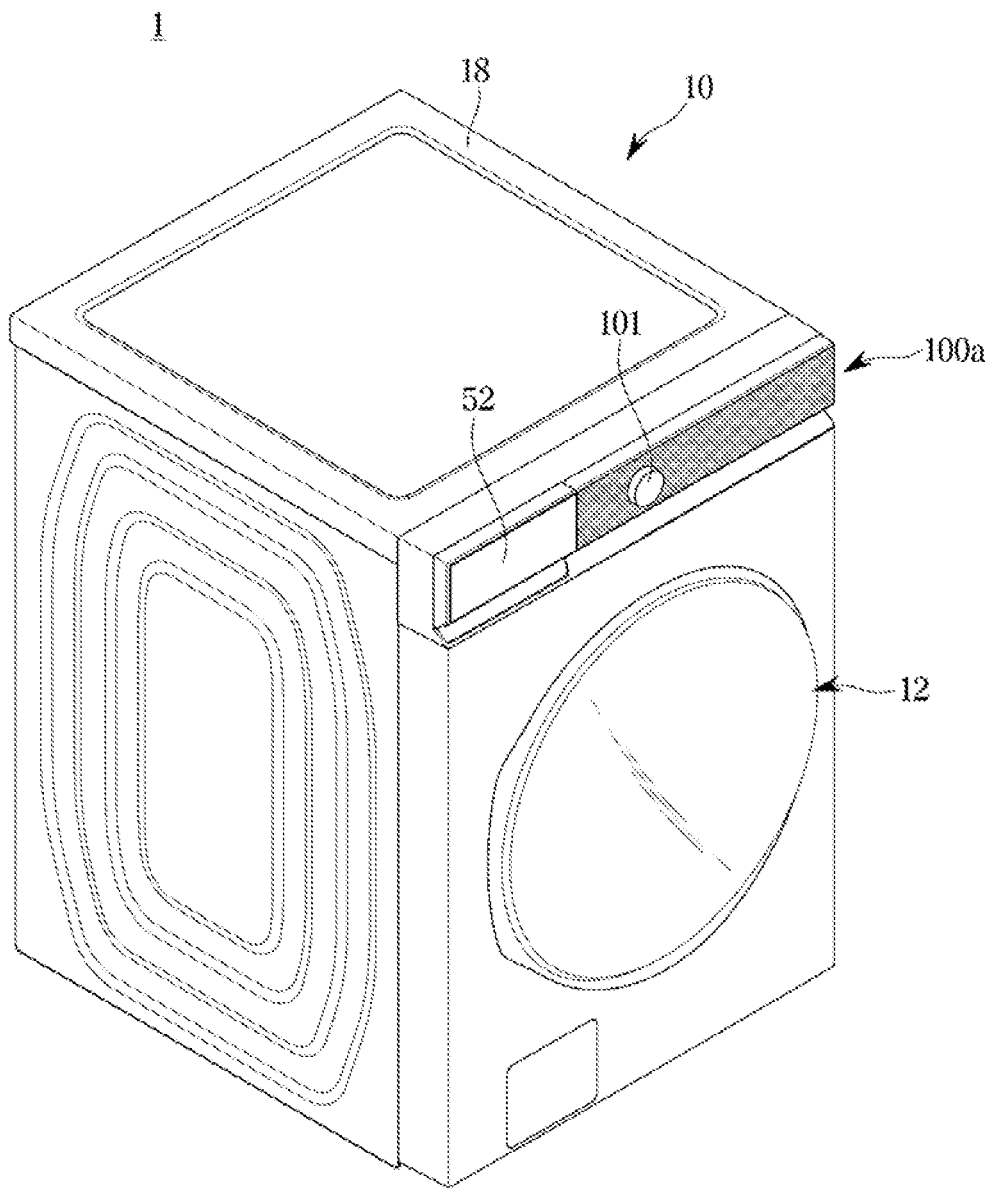
FIG. 22 is a view illustrating that the control panel of the washing machine illustrated in FIG. 1 has been replaced.

FIG. 22 is a view illustrating that the control panel of the washing machine illustrated in FIG. 1 has been replaced.

Referring to FIG. 22, a state in which the control device 100 of the washing machine 1 illustrated in FIG. 1 has been replaced with another control device 100a will be described.

Referring to FIG. 22, to change a design of the front surface of the control device 100 illustrated in FIG. 1, the control device 100 illustrated in FIG. 1 may be separated from the cabinet 10 and a control device 100a having a different design from that of the control device 100 illustrated in FIG. 1 may be mounted thereon.

The control device 100a illustrated in FIG. 22 may not only have a different design from that of the control device 100 of FIG. 1 but also be formed of a different material therefrom. Specifically, while the front surface of the control device 100 illustrated in FIG. 1 may be formed of glass, the front surface of the control device 100a illustrated in FIG. 22 may be formed of a metal.

As described above, because the control device 100 may be easily separated from and mount on the cabinet 10 in the washing machine 1 according to an embodiment of the present disclosure, the control device 100 illustrated in FIG. 1 may be easily replaced with the control device 100a having a different design and/or including a different material.

The embodiments of the present disclosure have been shown and described above with reference to the accompanying drawings. It will be understood by those of ordinary skill in the art that the present disclosure may be easily modified into other detailed forms without changing the technical principle or essential features of the present disclosure. However, the disclosed embodiments are illustrative and the scope of the present disclosure is not limited thereby.

What is claimed is:

1. A washing machine comprising:
   a cabinet including a top cover and a front surface;
   a drum rotatably disposed in the cabinet; and
   a control assembly configured to be mountable on the front surface of the cabinet and demountable from the front surface of the cabinet without removing the top cover of the cabinet,
   wherein the control assembly includes;
      a frame configured to be mountable on the front surface of the cabinet, and demountable from the front surface of the cabinet, by a fixing member passing through a front surface of the frame and through the front surface of the cabinet,
      a control panel including a panel coupling part, and configured to be mountable on the frame, and demountable from the frame, by the panel coupling part passing through the front surface of the frame, and configured to be movable between a first position where the control panel is separable from the frame and a second position where the control panel is coupled to the frame, and
      a printed circuit board configured to control the washing machine, the printed circuit board interposed between the frame and the control panel.

2. The washing machine of claim 1, wherein
   the frame includes a frame coupling part on the front surface of the frame, and
   the panel coupling part is configured to be couplable to the frame coupling part.

3. The washing machine of claim 1, wherein the frame includes a panel guide, and
   the control panel includes a coupling guide configured to be insertable into the panel guide while coupled to the frame.

4. The washing machine of claim 3, wherein the panel guide includes an inclined portion formed to be inclined in a direction where the coupling guide is inserted into the panel guide.

5. The washing machine of claim 3, wherein the coupling guide is formed to prevent separation from the panel guide while the control panel is located at the second position.

6. The washing machine of claim 1, wherein the control panel includes a fixing guide, and
   the frame includes a panel fixing part configured to guide movement of the fixing guide and coupled to the fixing guide by a panel fixing member while the control panel is located at the second position.

7. The washing machine of claim 6, wherein the panel fixing member is screw-coupled to the fixing guide and the panel fixing part.

8. The washing machine of claim 6, wherein the panel fixing member is formed to be wedge shaped and includes a first end and a second end,
   wherein the first end is adjacent to the second end while the panel fixing member is coupled to the fixing guide and the panel fixing part, and
   the first end and the second end are spaced apart to fix the fixing guide and the panel fixing part while the panel fixing member is coupled to the fixing guide and the panel fixing part.

9. The washing machine of claim 1, wherein the control panel includes a fixing guide, and
   the frame includes
      a panel fixing part configured to guide movement of the fixing guide; and
      a panel support configured to be elastically deformed while the control panel is located at the first position, and restored while the control panel is at the second position to support the fixing guide.

10. The washing machine of claim 1, wherein the cabinet includes a cabinet fixing part formed at the front surface, and the frame includes a frame fixing part formed to be fixed to the cabinet fixing part by the frame fixing member.

11. The washing machine of claim 1, wherein the control assembly is separable from the cabinet in a forward direction.

12. The washing machine of claim 1, wherein the control panel includes a module fixing part configured to fix the printed circuit board.

13. The washing machine of claim 1, wherein the control device includes a rotatable controller on the control panel that is configured to be couplable to the printed circuit board.

14. The washing machine of claim 1, wherein the frame includes a detergent case mount on which a detergent case is mountable.

15. A clothes care apparatus comprising:
    a washing machine; and
    a clothing dryer configured to be mountable on the washing machine and demountable from the washing machine, the washing machine includes:
       a cabinet having a top cover and a front surface,
       a drum rotatably disposed in the cabinet, and
       a control assembly mountable on a front surface of the cabinet and demountable from the front surface of the cabinet without removing the top cover while the clothing dryer is mounted on the washing machine, the control assembly including;
          a frame configured to be mountable on the front surface of the cabinet and demountable from the front surface of the cabinet, by a fixing member passing through a front surface of the frame and through the front surface of the cabinet when the frame is mounted on the front surface of the cabinet,
          a control panel including a panel coupling part, and configured to be mountable on the frame, and demountable from the frame, by the panel coupling part passing through the front surface of the frame when the control panel is mounted on the frame, and configured to be movable between a first position where the control panel is separable from the frame and a second position where the control panel is coupled to the frame, and
          a printed circuit board configured to control the washing machine, the printed circuit board interposed between the frame and the control panel.

16. A washing machine comprising:
    a cabinet including a top cover and a front surface;
    a drum rotatably disposed in the cabinet; and
    a control assembly configured to be mountable on the front surface of the cabinet and demountable from the front surface of the cabinet without removing the top cover of the cabinet,
    wherein the control assembly includes:
       a frame configured to be mountable on the front surface of the cabinet and demountable from the front surface of the cabinet,
       a control panel configured to be mountable on the frame and demountable from the frame and configured to be movable between a first position where the control panel is separable from the frame and a second position where the control panel is coupled to the frame, and a printed circuit board configured to control the washing machine, the printed circuit board interposed between the frame and the control panel, the control panel includes a fixing guide, and the frame includes:

a panel fixing part configured to guide movement of the fixing guide, and a panel support configured to be elastically deformed while the control panel is located at the first position, and restored while the control panel is at the second position to support the fixing guide.

* * * * *